United States Patent [19]
Kim

[11] Patent Number: 5,880,641
[45] Date of Patent: Mar. 9, 1999

[54] APPARATUS FOR STABILIZING CUT-OFF FREQUENCY USING A TRANSCONDUCTANCE

[75] Inventor: Chun-sup Kim, Kyonggi-do, Rep. of Korea

[73] Assignee: Samsung Electronics Co., Ltd., Kyungki-do, Rep. of Korea

[21] Appl. No.: 892,027

[22] Filed: Jul. 14, 1997

[30] Foreign Application Priority Data

Jul. 12, 1996 [KR] Rep. of Korea .................. 1996-28195

[51] Int. Cl.[6] ..................................................... H03F 3/191
[52] U.S. Cl. ........................................... 330/303; 330/284
[58] Field of Search ................................... 330/284, 279, 330/282, 303, 306, 254, 86, 110

[56] References Cited

U.S. PATENT DOCUMENTS

| | | | |
|---|---|---|---|
| 4,868,519 | 9/1989 | Shafer | 330/284 |
| 5,321,370 | 6/1994 | Yukawa | 330/258 |
| 5,673,003 | 9/1997 | Zocher | 330/303 |

*Primary Examiner*—Robert Pascal
*Assistant Examiner*—Khanh V. Nguyen
*Attorney, Agent, or Firm*—Sughrue, Mion, Zinn, Macpeak & Seas, PLLC

[57] ABSTRACT

An apparatus for stabilizing cut-off frequency using a transconductance, especially used in a high-frequency filter circuit, capable of maintaining constant frequency characteristics regardless of noise in association with a clock frequency, changes in the temperature, changes in the power supply voltage and errors in fabrication, when a filter circuit is installed in an IC (Integrated Circuit). The apparatus includes a filtering unit for passing only signals having a frequency band predetermined in the IC; a transconductance setting unit, installed out of the IC, for controlling a transconductance of the filtering unit; and a controlling unit for controlling a transconductance of the transconductance setting unit.

11 Claims, 4 Drawing Sheets

APPARATUS FOR STABILIZING CUT-OFF FREQUENCY USING A TRANSCONDUCTANCE

BACKGROUND OF THE INVENTION

1. Field of the Invention

The present invention relates to an apparatus for stabilizing cut-off frequency using a transconductance, and more specifically, to an apparatus for stabilizing cut-off frequency using a transconductance, capable of maintaining constant frequency characteristics regardless of changes in the temperature, changes in the power supply voltage and errors in fabrication, when a filter circuit is installed in an IC (Integrated Circuit).

2. Description of the Related Art

A demand for fabricating a filter into an integrated circuit, which is a matter of primary concern in an electronics industry, has shown an extreme interest in an SCF (Switched-Capacitor Filter) since the late 1970s. At the present, the SCF is commonly used through a MOSIC (Metal Oxide Semiconductor Integrated Circuit) technology.

For fabrication reasons, an active filter constructed with active elements, typically determines its accurate characteristics by adjusting resistance at the last process, which is a serious obstacle to fabricate the active filter into a complete IC.

A suggestion for overcoming such an obstacle is the SCF consisting of a switching device, a capacitor, and an operational amplifier. The operation characteristics of the SCF can be determined by the capacitor ratio that is suitable for easy fabrication of the filter into the IC.

Resistance used in the active filter can be substituted with the switching device switched by a predetermined switching frequency and the capacitor. The switching device can be easily fabricated using a MOSFET (Metal Oxide Semiconductor Field Effect Transistor). Accordingly, the integration of the filter is realized.

FIG. 1A is a conceptive circuit diagram embodying a resistance using a known switch 1 and a known capacitor $C_R$. FIG. 1B is an equivalent circuit diagram of FIG. 1A. The switch 1 is turned on/off according to a predetermined switching frequency.

FIG. 1C is a circuit diagram of a real embodiment of FIG. 1A. Clock signals in an inverted phase as compared to each other, are supplied to gate terminals of transistors $Q_1$ and $Q_2$, respectively. The transistors $Q_1$ and $Q_2$ are then exclusively turned on/off. A voltage $V_1$ input into the circuit is charged and discharged. As a result, a filtered frequency voltage $V_2$ is output.

When the transistor $Q_1$ is turned on, the capacitor $C_R$ is charged to $C_R \times V_1$. When the transistor $Q_2$ is turned on at the same time that the transistor $Q_1$ is turned off, the capacitor $C_R$ is discharged to $C_R \times V_2$.

The value of the charge q transmitted from the input to the output, is $$q = C_R(V1 - V2) \qquad (1)$$

The charge q is transmitted for a switching period $T_c$, current i(t) is, on an average, $$i(t) = \frac{\Delta q}{\Delta t} = C_R \frac{(V1 - V2)}{T_c} = \frac{V1 - V2}{(T_c/C_R)} \qquad (2)$$

When a resistance corresponding to $T_c/C_R$ is connected between input and output terminals, Eq. 2 shows the relationship between flowing current and voltage drop. Accordingly, an equivalent resistance that is approximately calculated by the following Eq. 3 is supposed to be connected between the input and the output terminals.

$$R_c \simeq \frac{T_c}{C_R} = \frac{1}{f_c C_r}, \quad f_c = \frac{1}{T_c} \qquad (3)$$

where $f_c$ is the inverse of the switching period $T_C$, i.e., switching frequency.

Based on the theory, the resistance that is an obstacle to integration can be substituted with the switching device and the capacitor.

FIG. 2A is a circuit diagram of an active filter embodied using a resistance. The active filter consists of: a resistance $R_C$ for controlling an input voltage $V_1$; an operational amplifier 2 outputting an output voltage $V_{out}$ by amplifying a signal generated from the resistance $R_c$; and a capacitor $C_1$ for feeding back the output from the operational amplifier 2. The output voltage $V_{out}$ is, $$V_{out} \simeq -\frac{\frac{1}{R_c C_1}}{j\omega} V_1, \quad \omega = 2\pi f_i \qquad (4)$$

where w is angular velocity of an input signal, and $f_1$ is a frequency of the input signal.

FIG. 2B is a circuit diagram of an SCF embodied using FIG. 1A, consisting of: a switch 1 for sampling an input voltage $V_1$ as a predetermined frequency; a capacitor $C_R$ for charging and discharging the voltage input into the switch 1; an operational amplifier 3 outputting an output voltage $V_{out}$ by amplifying a signal generated from the switch 1; and a capacitor $C_2$ for feeding back the voltage of a frequency to be filtered out of outputs from the operational amplifier 3. The capacitor $C_R$ for charging and discharging the voltage input into the switch 1, and the resistance $R_c$ has a relationship of Eq. 3. The output voltage $V_{out}$ is, $$V_{out} \simeq -\frac{\frac{f_c C_R}{C_2}}{j\omega} V_1, \quad \omega = 2\pi f_i \qquad (5)$$

where w is an angular velocity of an input signal, and $f_1$ and $f_c$ are the frequency of the input signal and a switching frequency, respectively.

When the filter circuits of FIGS. 2A and 2B are installed in an IC, the resistance and the capacitor cause an error of approximately ±20%, respectively, due to a fabrication error. Therefore, a wanted cut-off frequency for the filter circuit can be obtained by changing the switching frequency $f_c$. The switching frequency should be at least more than two times the frequency of the input signal according to Sampling theory. For a sufficient approximation to the resistance, typically, a switching frequency of more than ten times the frequency of the input signal is required.

However, the filter circuit installed in a conventional IC is limited to a low frequency filter because it cannot include an unlimited increase in switching frequency $f_c$. Additionally, noise is inevitably generated in the switching frequency $f_c$, which causes an instability of the circuit.

SUMMARY OF THE INVENTION

It is therefore an object of the present invention to provide an apparatus for stabilizing cut-off frequency using a transconductance, especially used in a high-frequency, capable of maintaining constant frequency characteristics regardless of noise in association with a clock frequency, changes in the temperature changes in the power supply voltage and errors in fabrication, when a filter circuit is installed in an IC (Integrated Circuit).

To achieve the above and other objects, the apparatus for stabilizing cut-off frequency using a transconductance includes:

a filtering unit for including:
a transconductance unit having a variable resistance changed when a transconductance is changed by an inputted voltage for control;
a capacitor having a capacitive reactance,
the filtering unit passing only a band of frequency determined by the resistance and the capacitive reactance out of supplied input signals;
a transconductance setting unit for making the transconducatance of the transconductance unit variable by supplying a variable output as an input control,
the variable output changed by a transconductance difference between a first transistor connected to a first input of a differential amplifier and a second transistor connected to a second input of the differential amplifier; and
a controlling unit for controlling to make the transconductance of either the first transistor or the second transistor of the differential amplifier variable.

The filtering unit, preferably, includes:
a transconductance unit including:
an input transistor having:
a drain that is connected to a power supply through a resistance;
a gate through which the input signal is supplied; and
a source; and
a transconductance variable transistor having:
a drain that is connected to the source of the input transistor;
a gate through which the voltage for control is supplied; and
a source that is grounded.
a transconductance of the transconductance variable transistor changed according to changes in the voltage for control;
an operational amplifier for filtering, having an inverted terminal that is connected to the drain of the input transistor; and
a capacitor one end of which is commonly connected to the drain of the input transistor and the inverted terminal of the operational amplifier; the other end of which is connected to an output terminal of the operational amplifier.

Preferably, the transconductance setting unit including:
a current mirror, connected to the power supply, for making a current flowing through the first input of the differential amplifier the same with a current flowing through the second input of the differential amplifier;
a bias voltage supply for supplying the first transistor and the second transistor of the differential amplifier with a first bias voltage and a second bias voltage;
a transconductance variable unit including:
a first transistor having a first transconductance in proportion to the first bias voltage; and
a second transistor having a second transconductance in proportion to the second bias voltage;
a first transconductance controller, connected between the current mirror and the transconductance variable unit, for carrying out the function of the current mirror and supplying as the voltage for controlling by amplifying and outputting a voltage generated due to a difference between the first transconductance and the second transconducatnce; and
a second transconductance controller, connected to the transconductance variable unit, for controlling an output of the first transconductance controller to be changed by changing a drain-source voltage of the second transistor to vary the second transconductance.

The controlling unit, preferably, includes:
an external resistance for varying a transconductance of either the first transistor or the second transistor according to a predetermined resistance; and
an external voltage supply terminal for varying a transconductance of either the first transistor or the second transistor according to an inputted adjusting voltage.

More particularly, the bias voltage supply includes:
a bias operational amplifier having:
an inverted terminal through which a direct voltage is inputted; and
a non-inverted terminal that is grounded through a first, a second and a third resistances; and
a bias transistor having:
a gate that is connected to an output terminal of the bias operational amplifier;
a source that is connected to the power supply; and
a drain that is connected to the non-inverted terminal of the bias operational amplifier through a fourth resistance.

The current mirror includes:
a first current mirror transistor having a source that is connected to the power supply;
a second current mirror transistor having:
a gate that is commonly connected to the gate of the first current mirror transistor and a drain of the second current mirror transistor; and
a source that is connected to the power supply;
a third current mirror transistor having a source that is connected to the drain of the first current mirror transistor; and
a fourth current mirror transistor having:
a gate terminal that is connected to a gate terminal of the third current mirror transistor and a drain of the fourth current mirror transistor; and
a source that is connected to the drain of the second current mirror transistor.

The first transconductance controller includes:
a control transistor having:
a source that is connected to the drain of the fourth current mirror transistor; and
a drain that is grounded through the controlling unit; and
a control operational amplifier having:
a non-inverted terminal that is connected to an external voltage supply terminal through which the adjusting voltage is supplied;
an inverted terminal that is connected to the source of the control transistor; and
an output terminal that is connected to a gate of the control transistor.

The transconductance variable unit includes:
a first transistor having:
a gate terminal that is commonly connected to the drain of the bias transistor and the fourth resistance;
a drain that is connected to the source of the current mirror transistor; and
a source that is grounded; and
a second transistor having:
a gate terminal that is commonly connected to a location on the connection of the first and the second resistances;

a drain that is connected to the source of the current mirror transistor; and a source that is grounded.

The second transconductance controller includes:

a fifth current mirror transistor having a drain that is connected to the drain of the third current mirror transistor;

a sixth current mirror transistor having a drain that is connected to the drain of the fourth current mirror transistor; and a current mirror/output operational amplifier having:

a non-inverted terminal that is commonly connected to the drain of the third current mirror transistor and the drain of the fifth current mirror transistor;

an inverted terminal that is commonly connected to the drain of the fourth current mirror transistor and the drain of the sixth current mirror transistor; and an output terminal that is commonly connected to the gate of the fifth current mirror transistor and the gate of the sixth current mirror transistor.

Further features and advantages of the invention will readily be apparent from the specification and from the drawings.

DETAILED DESCRIPTION OF THE PREFERRED EMBODIMENTS

An apparatus for stabilizing cut-off frequency using a transconductance, according to the present invention, will be hereinafter described in detail, referring to the accompanying drawings.

Figure 1A:
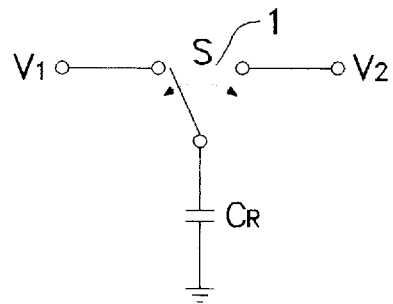
FIG. 1A is a conceptual circuit diagram embodying a resistance using a known switch and a known capacitor.
Figure 1B:
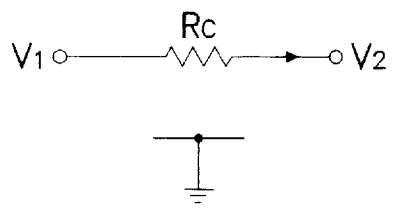
FIG. 1B is an equivalent circuit diagram of FIG. 1A.
Figure 1C:
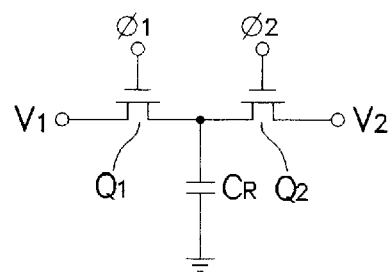
FIG. 1C is a circuit diagram of a real embodiment of FIG. 1A.
Figure 2A:
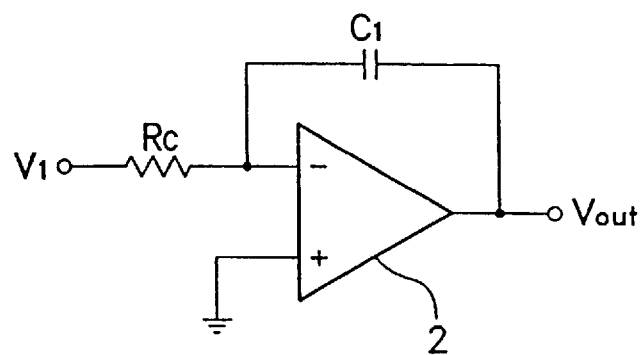
FIG. 2A is a circuit diagram of a general active filter.
Figure 2B:
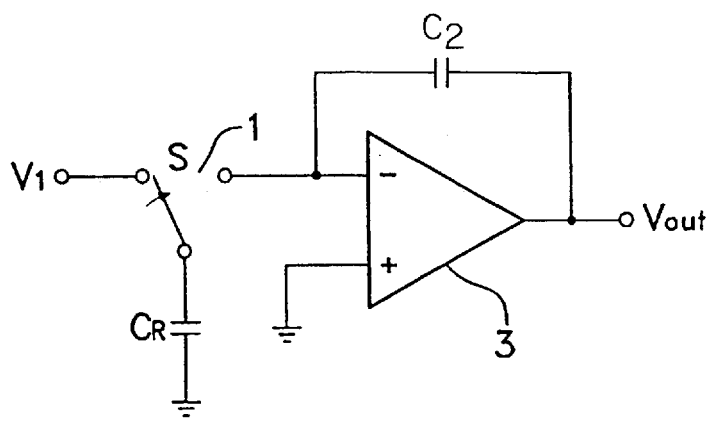
FIG. 2B is a circuit diagram of a filter corresponding to FIG. 1A.
Figure 3:
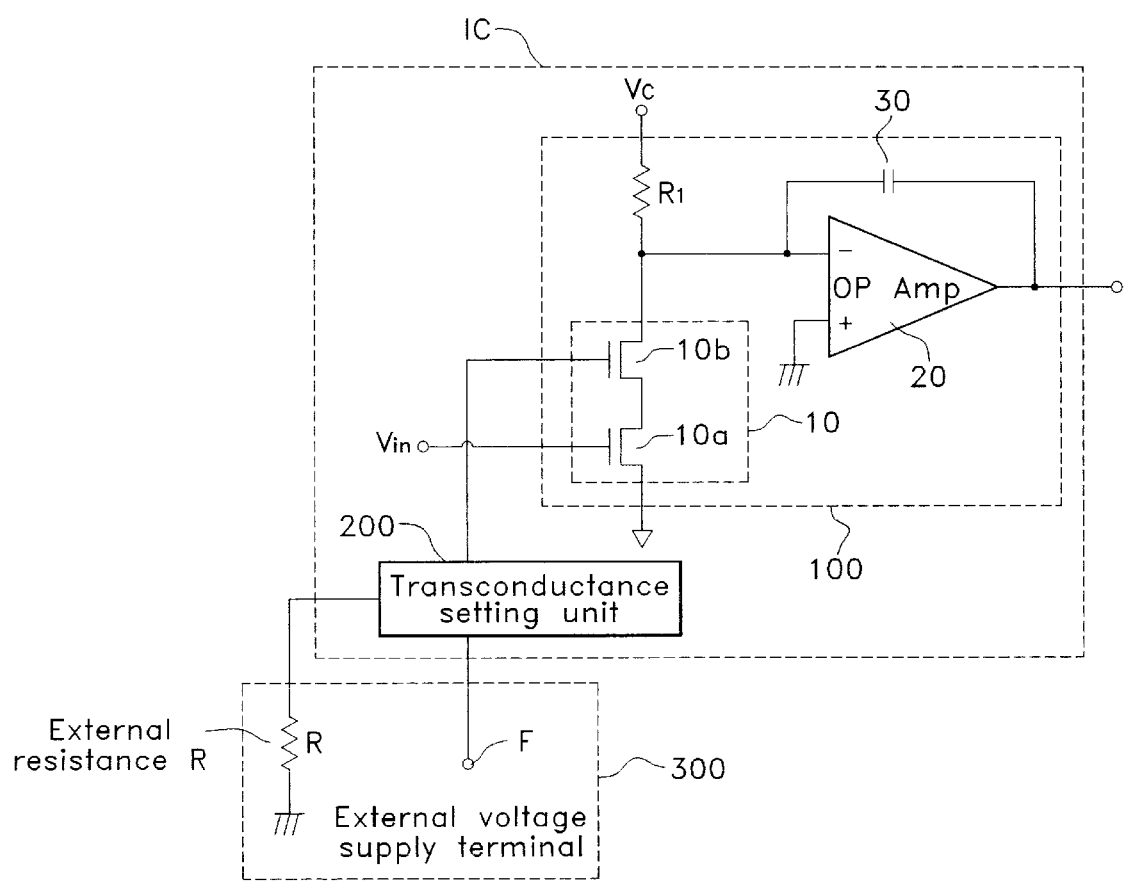
FIG. 3 is a block diagram of a preferred embodiment of an apparatus for stabilizing cut-off frequency using a transconductance according to the present invention.

FIG. 3 is a block diagram of a preferred embodiment of an apparatus for stabilizing cut-off frequency using a transconductance according to the present invention. Referring to the drawing, the cut-off frequency stabilizing apparatus includes: a filtering unit 100 for passing only signals having a predetermined frequency band; a transconductance setting unit 200 for determining a transconductance of the filtering unit 100; and an external controlling unit 300 for controlling a transconductance of the transconductance setting unit 200.

The filtering unit 100 includes: a transconductance unit 10 that changes the value of a resistance according to a flowing current; an operational amplifer 20 that receives and amplifies a signal generated from the transconductance unit 10; and a capacitor 30 that feeds back an output from the operational amplifier 20. Preferably, the transconductance unit 10 consists of MOSFETs 10a and 10b.

Figure 4:
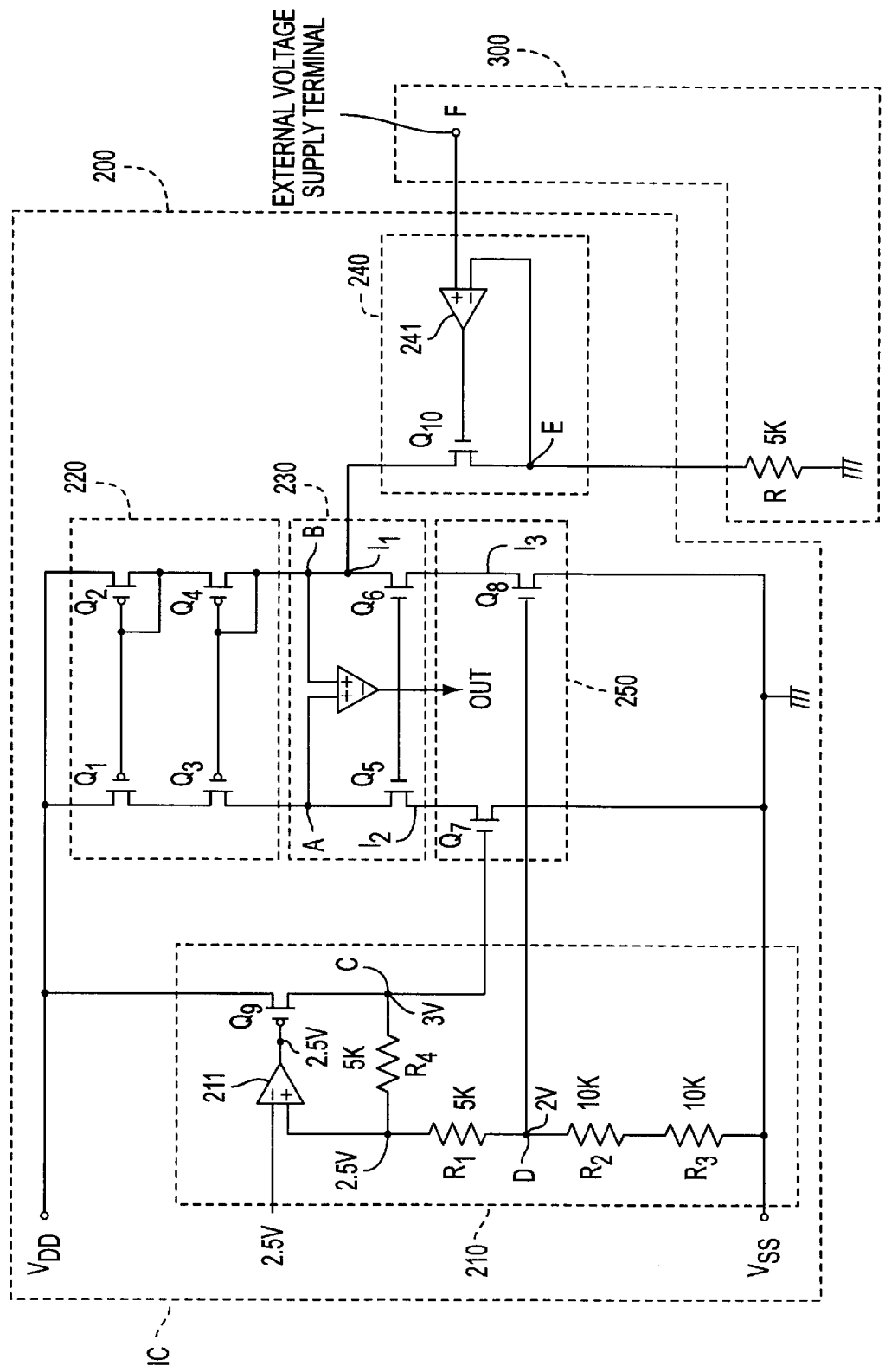
FIG. 4 is a circuit diagram of an embodiment of a transconductance setting unit and an external controlling unit of FIG. 3.

The transconductance setting unit 200, as shown in FIG. 4, includes a bias voltage supply 210 for supplying a bias voltage; a current mirror 220 for receiving a power supply voltage $V_{DD}$ and outputting the same amount of current to its two output terminals A and B; a second transconductance controller 230, connected to the output terminals A and B of the current mirror 220, for controlling transconductances of two transistors $Q_7$ and $Q_8$, and supplying an operation voltage to the transconductance unit 10 of the filtering unit 100; a first transconductance controller 240, connected to the output terminal B of the current mirror 220, for controlling the transconductances of the transistors $Q_7$ and $Q_8$ by branching and controlling the flowing current; and a transconductance variable unit 250 for varying the transconductance.

The bias voltage supply 210 includes an operational amplifer 211 and a transistor $Q_9$. The operational amplifier 211 has: an inverted terminal(−) through which a predetermined direct voltage is input; a non-inverted terminal(+) that is grounded through serially connected resistances $R_1$, $R_2$ and $R_3$; and an output terminal that is connected to a gate terminal of the transistor $Q_9$. A source terminal of the transistor $Q_9$ is connected to a power supply voltage $V_{DD}$. A drain terminal of the transistor $Q_9$ is connected to a location on the connection of the non-inverted terminal(+) of the operational amplifier 211 and the resistance $R_1$ through a resistance $R_4$.

The current mirror 220 includes transistors $Q_1$, $Q_2$, $Q_3$ and $Q_4$, and makes a collector current of the transistor $Q_3$ the same as a collector current of the transistor $Q_4$.

A source terminal of the transistor $Q_1$ is connected to the power supply voltage $V_{DD}$. A gate terminal of the transistor $Q_1$ is connected to a gate terminal of the transistor $Q_2$. A drain terminal of the transistor $Q_1$ is connected to a source terminal of the transistor $Q_3$.

The gate terminal of the transistor $Q_2$ is commonly connected to the gate terminal of the transistor $Q_1$ and a drain terminal of the transistor $Q_2$. A source terminal of the transistor $Q_2$ is connected to the power supply voltage $V_{DD}$. The drain terminal of the transistor $Q_2$ is connected to a source terminal of the transistor $Q_4$.

The source terminal of the transistor $Q_3$ is connected to the drain terminal of the transistor $Q_1$. A gate terminal of the transistor $Q_3$ is connected to a gate terminal of the transistor $Q_4$. A drain terminal of the transistor $Q_3$ is connected to the node A that is a non-inverted terminal(+) of an operational amplifier 231.

The gate terminal of the transistor $Q_4$ is connected to the gate terminal of the transistor $Q_3$ and a drain terminal of the transistor $Q_4$. The source terminal of the transistor $Q_4$ is connected to the drain terminal of the transistor $Q_2$. The drain terminal of the transistor $Q_4$ is connected to the node B that is an inverted terminal(−) of the operational amplifier 231.

The second transconductance controller 230 includes the operational amplifier 231, a transistor $Q_5$ and a transistor $Q_6$.

A non-inverted terminal(+) of the operational amplifier 231 is connected to the drain terminal of the transistor $Q_3$. An inverted terminal of the the operational amplifier 231 is connected to the drain teminal of the transistor $Q_4$. An output terminal of the operational amplifier 231 is connected to the transconductance unit 10 of the filtering unit 100.

A drain terminal of the transistor $Q_5$ is commonly connected to the drain terminal of the transistor $Q_3$ and the non-inverted terminal(+) of the operational amplifier 231. A gate terminal of the transistor $Q_5$ is commonly connected to the output terminal of the operational amplifier 231 and a gate terminal of the transistor $Q_6$. A source terminal of the transistor $Q_5$ is connected to a drain terminal of a transistor $Q_7$.

The gate terminal of the transistor $Q_6$ is commonly connected to the output terminal of the operational amplifier 231 and the gate terminal of the transistor $Q_5$. A drain terminal of the transistor $Q_6$ is commonly connected to the drain terminal of the transistor $Q_4$ and the inverted terminal of the operational amplifier 231. A source terminal of the transistor $Q_6$ is connected to a drain terminal of a transistor $Q_8$.

The first transconductance controller 240 includes a transistor $Q_{10}$ and an operational amplifier 241. A source terminal of the transistor $Q_{10}$ is connected to the node B that is the drain terminal of the transistor $Q_4$. A gate terminal of the transistor $Q_{10}$ is connected to an output terminal of the operational amplifier 241. A drain terminal of the transistor $Q_{10}$ is connected to an end of an external resistance R. A non-inverted terminal(+) of the operational amplifier 241 is connected to an external voltage supply terminal F for controlling the transconductance. An inverted terminal (−) of the operational amplifier 241 is connected to the drain terminal of the transistor $Q_{10}$. The output terminal of the operational amplifier 241 is connected to the gate terminal of the transistor $Q_{10}$.

The transconductance variable unit 250 includes transistors $Q_7$ and $Q_8$. A gate terminal of the transistor $Q_7$ is connected to a drain terminal of the transistor $Q_9$. The drain terminal of the transistor $Q_7$ is connected to the source terminal of the transistor $Q_5$. A source terminal of the transistor $Q_7$ is grounded. A gate terminal of the transistor $Q_8$ is connected to a node D that is on the connection of the resistances $R_1$ and $R_2$. A drain terminal of the transistor $Q_8$ is connected to the source terminal of the transistor $Q_6$. A source terminal of the transistor $Q_8$ is grounded.

The operation of the cut-off frequency stabilizing apparatus according to the present invention will be described in detail.

First, a brief description on the theoretical basis that a cut-off frequency can be stabilized by adjusting the transconductance of a transistor will be given prior to the description of the operation of the cut-off frequency stabilizing apparatus. Conductance corresponds to the inverse number of resistance. For description purposes, a FET (Field Effect Transistor) is taken as an example.

The conductance $g_m$ of the FET is, $$g_m = \frac{\partial I_D}{\partial V_{GS}} \quad (6)$$

where $I_D$ is a drain current on a bias point, and $V_{GS}$ is a voltage between a gate and a source.

The transconductance $g_m$ of the FET corresponds to a slope on an operation point Q in a FET transmission curve. When the transconductance is varied by a voltage on a circuit, the resistance is varied. The effect called as VVR (Voltage-Variable Resistance) effect.

Referring to an $I_D$–$V_{DS}$ output curve of the FET (where $V_{DS}$ is a voltage between a drain and a source), it is noted that when $V_{DS}$ is small, the output curve is almost straight and the slope thereof depends on $V_{GS}$.

In other words, this suggests that when the FET operates in a linear area, it is possible to electronically vary the resistance by varying $V_{GS}$.

Direct current resistance $R_{DS}$ between a drain and a source is, $$\frac{1}{R_{DS}} = \frac{I_D}{V_{DS}} \simeq g_m \quad (7)$$

As shown in Eq. 7, the inverse number of the direct current resistance $R_{DS}$ in the linear area with respect to a given $V_{GS}$ is the same with the transconductance $g_m$ in the linear area with respect to $V_{GS}$. Therefore, it is possible to vary the resistance by varying the voltage of either $V_{GS}$ or $V_{DS}$. The VVR effect is realized in this manner.

As shown in FIG. 3, an external resistance R and an external voltage supply terminal F of an external controlling unit 300 are installed on the outside of an IC after a filtering unit 100 and a transconductance setting unit 200 are installed in the IC. A wanted stabilized cut-off frequency can be obtained by controlling the transconductance as below, regardless of changes in the temperature, changes in the power supply voltage, and errors in fabrication when a filter circuit is installed in the IC.

First, 2.5 volts are supplied to the inverted terminal(−) of the operational amplifier 211 in the bias voltage supply 210. At this time, the non-inverted terminal(+) of the operational amplifier 211 becomes 2.5 volts, which is a charateristic of the operational amplifier 211. The voltage on the respective ends of the serially connected resistances is divided by the respective resistance ratio. As a result, node C becomes 3 volts and a node D becomes 2 volt.

Voltages generated from nodes C and D are supplied to transistors $Q_7$ and $Q_8$, respectively.

The transistors $Q_7$ and $Q_8$ have the same characteristics, and a 1 volt difference exists between voltages supplied to their respective gate terminals. Accordingly, a current $I_2$ flowing through the transistor $Q_7$ is larger than a current $I_3$ flowing through the transistor $Q_8$, and therefore, the voltage at node A becomes larger than the voltage at node B.

The current flowing through the transistors $Q_7$ and $Q_8$ is supplied from node A and node B which are two output terminals of the double constructed current mirror 220.

At this time, a voltage difference between the voltages at nodes A and B is amplified by the operational amplifier 231 and output to the output terminal in order to compensate the voltage difference between the nodes A and B. As a result, voltages of the gate terminals of the transistors $Q_5$ and $Q_6$ connected to the output terminal of the operational amplifier 231 are also increased.

When the voltages of the gate terminals of the transistors $Q_5$ and $Q_6$ are increased, the voltages of the source terminals of the transistors $Q_5$ and $Q_6$ are, accordingly, increased having a voltage difference of a threshold voltage.

Consequently, the voltage $V_{DS}$ that is a voltage between the drain terminals and the source terminals of the transistors $Q_7$ and $Q_8$ is increased, thereby increasing current.

In other words, since the transconductance is an inverse number of the resistance, the possibility that the transconductance can be varied implys the possibility that the resistance can be controlled to have a desirable value. Therefore, the transconductance of the filtering unit 100 is varied to have a desirable value by connecting the output terminal of the operational amplifier 231 that is the output terminal of the transconductance setting unit 200 to the gate terminal of the transconductance unit 10 of the filtering unit 100. Thereby, it is possible to construct a stabilized filter circuit, even when the capacity of the capacitor included in the filtering unit 100 is changed in the range of ±20%.

The transconductance can be varied to have a wanted value by controlling the current $I_1$ flowing out according to the voltage difference between the voltages at nodes A and B.

The current $I_1$ can be controlled by varying the external resistance R located out of the IC. By controlling the current $I_1$, the transconductace can be controlled.

When the value of the external resistance R is made smaller, the current flowing through the resistance R is increased. As a result, the drain voltage of the transistor $Q_6$ is dropped. The drain voltage of the transistor $Q_8$ of the transconductance variable unit 250 is also dropped. Consequently, the transconductance of the transistor $Q_8$ is dropped.

At this time, the operational amplifier 231 amplifies the voltage difference between the nodes A and B and outputs the amplified voltage to the output terminal OUT. The amplified and output voltage is supplied to a gate terminal (not shown) of the transconductance unit 10 of the filtering unit 100. Accordingly, the transconductance can be controlled to have a wanted value. When a resitance having a 1% error is used as the external resistance, the filter can be designed to have a 1% error.

Additionally, when the voltage supplied to the external voltage supply terminal F of the second transconductance controller 240 is controlled, the voltage of the node E is varied. As a result, the current flowing through the external resistance R is also varied, and therefore, the transconductance of the transistor $Q_8$ can be varied in the same manner that the value of the resitance is varied. By controlling the output of the operational amplifier 231, the transconductance unit 10 of the filtering unit 100 can be varied, and a filter construction having a wanted frequency band and a wanted amplification can be obtained.

When the output of the operational amplifier 231 is input through the gate of the transistor 10b, the output of the operational amplifier 231 is varied. The gate voltage is then varied, and the transconductance of the transistor 10b is accordingly varied. Therefore, it is possible to design a filter capable of passing only wanted signals out of signals inputted through the transistor 10a.

The apparatus for stabilizing cut-off frequency using transconductance according to the present invention is not restricted to the above filter circuit, and it is clearly understood that many variations may be made within the scope and spirit of the present invention by anyone skilled in the art. For example, if the feed back capacitor 30 of the filtering unit 100 is substituted with a resistance, the apparatus can be used as an amplification circuit without any degradation of the performance.

What I claim is:

1. An apparatus for stabilizing cut-off frequency using transconductance, comprising:
    a filtering unit for passing signals having a predetermined frequency band;
    a transconductance setting unit for varying the transconductance of said filtering unit by outputting a control signal to said filtering unit; and
    a control unit for controlling said transconductance setting unit;
    wherein said filtering unit comprises:
        a transconductance unit having a variable resistance which is varied in response to said control signal which varies the transconductance of said transconductance unit; and
    wherein said transconductance unit comprises:
        an input transistor having a drain connected to a power supply through a resistance, a gate through which said control signal is supplied, and a source; and
        a transconductance variable transistor having a drain connected to said source of said input transistor, a gate through which an input voltage is supplied, and a source that is grounded;
        a transconductance of said transconductance variable transistor being changed according to changes in the input voltage.

2. An apparatus for stabilizing cut-off frequency using transconductance, comprising:
    a filtering unit for passing signals having a predetermined frequency band;
    a transconductance setting unit for varying the transconductance of said filtering unit by outputting a control signal to said filtering unit; and
    a control unit for controlling said transconductance setting unit;
    wherein said transconductance setting unit comprises:
        a differential amplifier having a non-inverted input and an inverted input;
        a current mirror, connected to a power supply, and further connected to said non-inverted input and to said inverted in put of said differential amplifier, wherein said current mirror is arranged to ensure that a current flowing through said non-inverted input of said differential amplifier is the same as a current flowing through said inverted input of said differential amplifier;
    a transconductance variable unit comprising:
        a first transistor connected to said non-inverted input of said differential amplifier; and
        a second transistor connected to said inverted input of said differential amplifier;
        a bias voltage supply for supplying said first transistor and said second transistor of said differential amplifier with a first bias voltage and a second bias voltage, respectively, wherein a first transconductance of said first transistor is proportional to said first bias voltage, and a second transconductance of said second transistor is proportional to said second bias voltage;
        a first transconductance controller, connected between said current mirror and said transconductance variable unit, for amplifying and outputting a voltage representing a difference between said first transconductance and said second transconductance; and
        a second transconductance controller, connected to said transconductance variable unit, for varying an output of said first transconductance controller by changing a drain-source voltage of said second transistor to vary said second transconductance.

3. The apparatus of claim 2, wherein said control unit comprises an external resistance for varying a transconductance of one of said first transistor and said second transistor according to a predetermined resistance.

4. The apparatus of claim 2, wherein said control unit comprises an external voltage supply terminal for varying the transconductance of one of said first transistor and said second transistor.

5. The apparatus of claim 2, wherein said bias voltage supply comprises:
    a bias operational amplifier comprising:
        an inverted input through which a direct voltage is input; and
        a non-inverted input that is grounded through a first resistor, a second resistor and a third resistor; and
    a bias transistor having a gate connected to an output terminal of said bias operational amplifier, a source connected to the power supply, and a drain connected to said non-inverted input of said bias operational amplifier through a fourth resistor.

6. The apparatus of claim 5, wherein said first resistance is 5 KΩ, said second and said third resistances are 10 KΩ; and said fourth resistance is 5 KΩ.

7. The apparatus of claim 2, wherein said current mirror comprises:
  a first current mirror unit comprising:
    a first current mirror transistor having a source connected to the power supply;
    a second current mirror transistor having a gate commonly connected to a gate of said first current mirror transistor and a drain of said second current mirror transistor, and a source connected to the power supply;
  a second current mirror unit comprising:
    a third current mirror transistor having a source connected to said drain of said first current mirror transistor; and
    a fourth current mirror transistor having a gate connected to a gate of said third current mirror transistor and a drain of said fourth current mirror transistor, and a source connected to said drain of said second current mirror transistor.

8. The apparatus for stabilizing cut-off frequency using a transconductance of claim 7, wherein said second transconductance controller comprises:
  a control transistor having a source connected to said drain of said fourth current mirror transistor, and a drain that is grounded through said control unit; and
  a control operational amplifier having:
    a non-inverted input connected to an external voltage supply terminal through which the adjusting voltage is supplied;
    an inverted input connected to said drain of said control transistor; and
    an output terminal connected to a gate of said control transistor.

9. The apparatus of claim 7, wherein said second transconductance controller comprises:
  a fifth current mirror transistor having a drain connected to said drain of said third current mirror transistor;
  a sixth current mirror transistor having a drain connected to said drain of said fourth current mirror transistor; and
  differential amplifier wherein said non-inverted terminal is commonly connected to said drain of said third current mirror transistor and said drain of said fifth current mirror transistor;
  said inverted terminal is commonly connected to said drain of said fourth current mirror transistor and said drain of said sixth current mirror transistor; and
  an output terminal commonly connected to a gate of said fifth current mirror transistor and a gate of said sixth current mirror transistor.

10. The apparatus of claim 1, wherein said filtering unit further comprises:
  an operational amplifier, having an inverted terminal that is connected to said drain of said input transistor; and
  a capacitor, one end of which is commonly connected to said drain of said input transistor and said inverted terminal of said operational amplifier; the other end of which is connected to an output terminal of said operational amplifier.

11. The apparatus of claim 9, wherein said first transistor of said transconductance variable unit includes a gate commonly connected to said drain of said bias transistor and said fourth resistance, a drain to said source of said fifth current mirror transistor, and a source that is grounded; and wherein said second transistor of said transconductance variable unit includes a gate commonly connected to a location where said first resistor and said second resistor connect, a drain connected to said source of said sixth current mirror transistor, and a source that is grounded.

* * * * *